United States Patent [19]
Hester

[11] Patent Number: 5,973,633
[45] Date of Patent: Oct. 26, 1999

[54] WEIGHTED CAPACITOR ARRAY WITH SELECTIVE GROUPING TO FORM ARRAY ELEMENTS

[75] Inventor: Richard Knight Hester, Whitewright, Tex.

[73] Assignee: Texas Instruments Incorporated, Dallas, Tex.

[21] Appl. No.: 08/993,823

[22] Filed: Dec. 18, 1997

Related U.S. Application Data

[60] Provisional application No. 60/033,138, Dec. 20, 1996.

[51] Int. Cl.$^6$ ................................................ H03M 1/12
[52] U.S. Cl. ........................................ 341/172; 341/155
[58] Field of Search .................................. 341/172, 118, 341/155, 120

[56] References Cited

U.S. PATENT DOCUMENTS 5,734,583  3/1998  Shou et al. .............................. 364/491

*Primary Examiner*—Howard L. Williams
*Assistant Examiner*—Peguy Jean Pierro
*Attorney, Agent, or Firm*—Alan K. Stewart; Wade James Brady, III; Richard L. Donaldson

[57] ABSTRACT

An integrated circuit for analog to digital conversion using a plurality of unit capacitors (201). The value of each unit capacitor (201) has a nonlinear spatial component determined by the location of the unit capacitor (201) on the integrated circuit. A plurality of array capacitors (101a–101e) are formed from the unit capacitors (201) such that each array capacitor (101a–101e) includes a selected group of unit capacitors (201). The unit capacitors (201) that make up each array capacitor (101a–101e) are selected based upon the nonlinear spatial component in the unit capacitance value.

14 Claims, 3 Drawing Sheets

WEIGHTED CAPACITOR ARRAY WITH SELECTIVE GROUPING TO FORM ARRAY ELEMENTS

This application claims priority under 35 USC § 119(e)(1) of provisional application No. 60/033,138 filed Dec. 20, 1996.

BACKGROUND OF THE INVENTION

1. Field of the Invention

The present invention relates, in general, to layout and arrangement of components on a semiconductor chip, and, more particularly, to arrangement of capacitors for precision matching in an integrated circuit.

2. Relevant Background

Because capacitors are easily implemented in MOS fabrication technology, capacitors rather than resistors are used as the precision components in many analog-to-digital converters (ADCs) and digital-to-analog converters (DACs). A plurality of capacitors are used as the precision elements in an array. A technique referred to as "charge redistribution" is used to operate ADCs and DACs using capacitors as the storage element. The accuracy of the ADC converter using the charge redistribution technique is primarily determined by the matching of the capacitors in the array.

In a charge redistribution converter, a sample is stored dynamically with minimum loss in an array of precision matched capacitors. The sample is stored as charge that is moved from one array capacitor to another by MOSFET switches. One of the more widely used charge redistribution converter techniques is based on successive approximation. This technique primarily uses capacitors having binary weighted values with a top plate of all the capacitors connected to one input of a comparator and the bottom plates switched between various voltages. The steering of the various switches is controlled by the comparator through auxiliary logic circuitry.

The charge redistribution conversion process is begins with a sampling step followed by a charge redistribution step in which the output digital word (or "byte") is determined. In the sampling step, the top plates of the capacitors are normally connected to ground or some suitable sample reference voltage, and the bottom plates are coupled to the input voltage. This results in a stored voltage on the bottom plate that is proportional to the input voltage.

The sample step may be followed by an optional hold step in which the top plate is electrically isolated and the bottom plates are normally connected to ground or some suitable hold reference voltage. During a hold step, the charge on the top plate is conserved and the top plate potential goes to the negative of the input voltage. Because the hold step can complicate the conversion process, it is often not used.

In the conversion or redistribution step, each individual bit of the output byte is determined by sequentially connecting the bottom plates of each of the capacitors to either a redistribution reference voltage or to ground until the voltage on the top plate reaches a predetermined voltage. This is usually the trip point of the comparator.

The array is a collection of capacitors having top plates that are all connected to a comparator input node. As used herein, the term "array capacitor" means any of the capacitors used for charge redistribution and is not intended to imply that the capacitors are arranged in a grid or geometric array. Most often, a binary array is used, meaning that the ratios of the capacitors within the array are powers of 2 (i.e., $C_N=2C_{N-1}=4C_{N-2}=2^{N-1}C1$). The ADC linearity is determined by the errors in these ratios.

Error mechanisms in semiconductor fabrication processes that affect these ratios include patterning and etching variations when fabricating the capacitor plates and dielectric thickness variations when fabricating the insulator layer. Other error mechanisms are known and may dominate in a particular fabrication process including variations in dielectric constant or insulator composition. The present invention addresses ADC linearity limitations that are caused by the control of the fabrication process.

To reduce factory variations, each array capacitor is formed from a plurality of small, identical "unit capacitors". In this manner, process variations that affect the periphery of a unit capacitor have a proportionate affect on each of the array capacitors. The grouping of the unit capacitors in the array mimics the desired capacitor ratios. For example, if a ratio $C_2=2C_1$ is desired, then $C_2$ has two capacitors identical to $C_1$ connected in parallel. This means that a binary array of N capacitors has of $2^N-1$ identical unit capacitors. The capacitance of each unit capacitor is typically that of the smallest capacitor in the array.

To minimize differences between unit capacitors they are typically placed on a regular two-dimensional grid. The grid is extended one extra unit in all four directions to surround the array by a perimeter of dummy unit capacitors. The dummy unit capacitors make the local environment of all interior unit capacitors as identical as possible. In spite of this great care in array layout, the complete elimination of fabrication errors is virtually impossible.

It has been recognized that many fabrication processes have spatial variations across a wafer and across a single integrated circuit chip. These variations make precision device matching difficult. Capacitor arrays for charge redistribution ADC devices have been formed from symmetrically arranged groups of the unit capacitors to compensate for spatial parameter variation across the chip. However, it has been discovered that such groupings only compensate for linear parametric variations. Hence, certain fabrication technologies that exhibit nonlinear parametric variations have produced poor device matching when simple symmetric arrangement is used.

Although capacitors can be formed using thin film materials such as polysilicon or polycide for the electrodes, such processes are relatively expensive to add to a conventional CMOS fabrication process. Also, in conventional CMOS processes, the dielectric placed between layers of thin films is typically quite thin. Although maximizing the capacitance per unit area is often desired, the thin film capacitors resulting from a conventional CMOS flow have such high capacitance per unit area that each of the array capacitors must be physically small to provide a suitable input impedance for the ADC. However, physically small capacitors exhibit greater process variability. Hence, it would be desirable to fabricate the unit capacitors using structures that allow physically large capacitors with low capacitance per unit area.

Metal-to-metal capacitors are formed during the interconnect metallization portion of conventional CMOS processing. The metal layers are typically separated by a thick dielectric that gives them relatively low capacitance per unit area. Unfortunately, prior efforts to arrange the metal-to-metal capacitors using the same symmetrical arrangements used for polysilicon capacitors have resulted in poor matching and greater ADC linearity errors. What is needed is a capacitor arrangement and method for arranging capacitors that compensate for process variations not handled by conventional symmetrical layouts.

A great deal of effort and expense has occurred in the industry recently to develop methods and structures that correct these errors. One method uses a second binary array of capacitors that adds to the regular charged redistribution capacitor array and error correcting signal to compensate for the mismatch. This error correcting signal is then stored and the other error correcting signals for the other capacitors in the regular capacitor array are determined and subsequently stored for later correction of other capacitance mismatch.

The present invention has particular application in charge redistribution ADCs that use an array of matched capacitors. However, it should be understood that the present invention is useful in any device requiring matched performance between devices on the chip. For example, matched capacitor arrays are used in digital to analog converters and switched capacitor filters also. Moreover, other types of matched devices, such as matched resisters or matched active devices including field effect transistor or bipolar transistors, can make use of the layout method and structure in accordance with the present invention. However, for purposes of discussion the present invention will be illustrated in terms of a charge redistribution ADC only.

SUMMARY OF THE INVENTION

The present invention involves an integrated circuit for analog to digital conversion using a plurality of unit capacitors. The value of each unit capacitor has a nonlinear spatial component determined by the location of the unit capacitor on the integrated circuit. A plurality of array capacitors are formed from the unit capacitors such that each array capacitor includes a selected group of unit capacitors. The unit capacitors that make up each array capacitor are selected based upon the nonlinear spatial component in the unit capacitance value.

In another aspect, the present invention involves a method for arranging a number (N) of devices D on a circuit chip. The devices are related to each other such that a device parameter for each device is a preselected function of the device parameter for another device. A plurality of unit devices are provided on a chip and a linear component of variation for each unit device is determined. Also, a non-linear component of variation for each of unit devices is determined. The linear and nonlinear variations are a function of spatial location of the unit device on the chip and so vary from device-to-device. The plurality of unit devices are grouped into N sets such that each set is chosen to have preselected parametric value. At least one set includes unit devices chosen so as to account for the sum of the nonlinear variations.

DETAILED DESCRIPTION OF THE PREFERRED EMBODIMENTS

Figure 1:
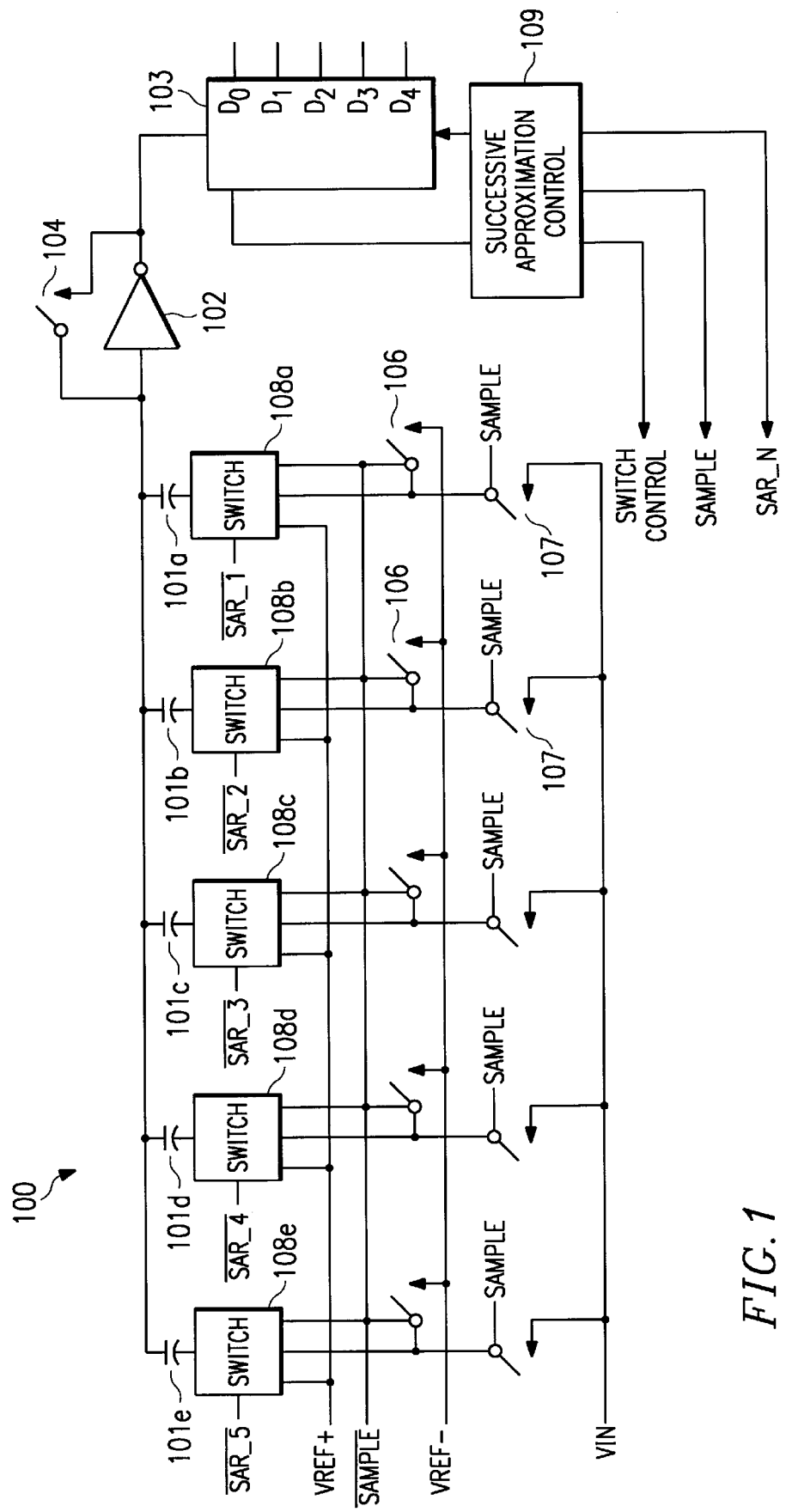
FIG. 1 shows in schematic view a charge redistribution analog-to-digital converter in accordance with the present invention.

In a charge redistribution analog-to-digital converter (ADC) such as ADC 100 shown in FIG. 1, linearity depends primarily upon capacitance ratios between array capacitors 101a–101e. If, for example, the capacitance of each array capacitor 101a–101e is increased by the same factor, linearity of ADC 100 is unchanged. Hence, ADC linearity depends not on the variations of the capacitance of array capacitors 101a–101e, but on their variations with respect to the other array capacitors 101a–101e in the same ADC.

The present invention involves a method to determine an arrangement or grouping of unit capacitors (such as unit capacitors 201 shown in FIG. 2) into array capacitors 101a–101e that provides suitable linearity. Array capacitors 101a–101e may be fabricated from any number of available technologies (e.g., metal/oxide/metal, metal/oxide/polycide, and polycide/oxide/polysilicon). Because each capacitor fabrication technology exhibits its own spatial variation characteristics, each technology may require a unique grouping of unit capacitors 201 into array capacitors 101a–101e. Accordingly, although the particular capacitor structures described herein are useful in themselves, greater utility is provided by the layout method in accordance with the present invention to determine a capacitor arrangement that optimizes linearity for a given capacitor process and ADC design.

An initial step in the method in accordance with the present invention is to characterize the matching capabilities of a particular capacitor technology. Capacitance variation varies from process to process. The matching capability of a selected fabrication process is characterized by comparing an ADC's capacitor errors to an "ideal" unit capacitor. An ideal unit capacitor is defined to be the average unit capacitor of that ADC. A key assumption made in the analysis in accordance with the present invention is that the variation of capacitance in unit capacitors 201 across a chip is composed of two parts, one that is linear and one that varies nonlinearly with location. This comparison is conveniently expressed as a covariance between measured capacitance of unit capacitors 201 as a function of spatial location (i.e., X and Y coordinates) of the unit capacitors 201.

Once a selected fabrication process is characterized, is necessary to find spatial functions that provide the best agreement with the observed covariance. Spatial functions are mathematical expressions that describe the variation of capacitance with spatial location of the unit capacitors on a chip. In the absence of any physical intuition about the spatial dependence of unit capacitor variations, a power series is a good first approximation.

Figure 2:
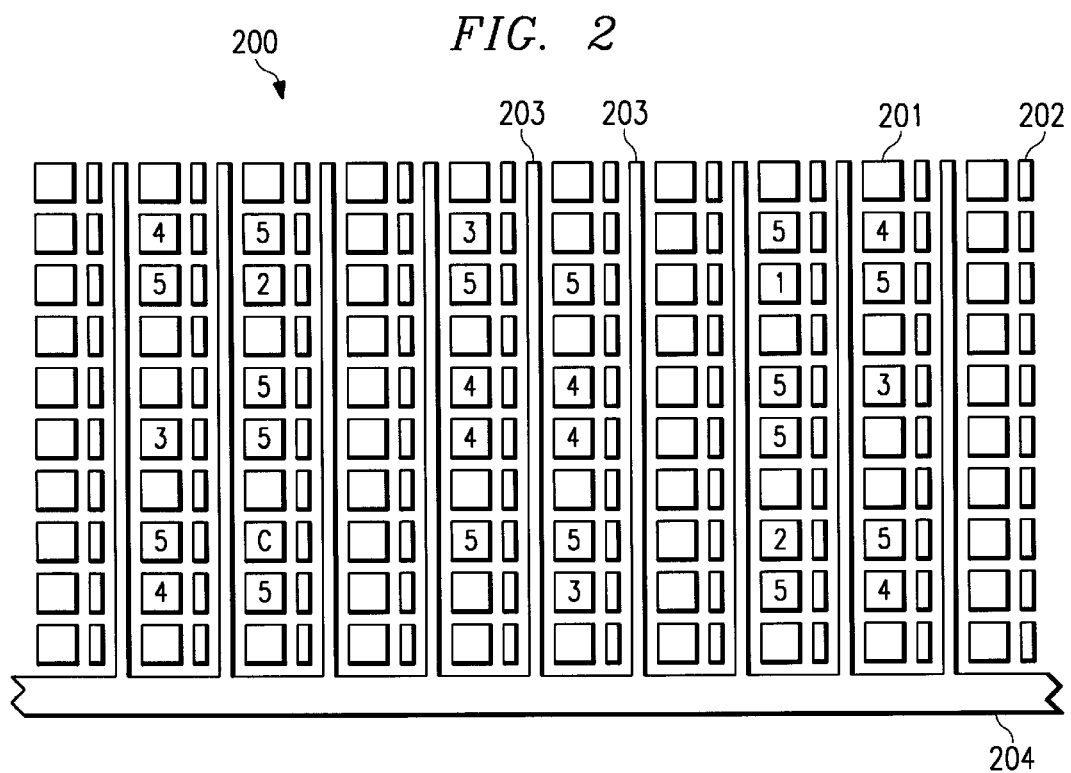
FIG. 2 shows a plan view of a unit capacitor layout for the charge redistribution ADC shown in FIG. 1.

For ease of discussion, the present invention is described in terms of an array of capacitors such as shown in FIG. 2 where each unit capacitor 201 can be identified by is location along a horizontal X axis and a vertical Y axis. It is possible to produce high quality fits of the measured variances and covariance with a power series in X and Y. To make a physical interpretation of the extracted parameters of covariance, the extracted parameters must make statistical sense. Many potential spatial functions result in negative variances of one or more of the spatial parameters. This is impossible in a real statistical process so it prevents any physical interpretation. Therefore a constraint is imposed upon the choice of the spatial function in that the extracted variances must be non-negative.

This constraint results in different spatial functions chosen to model the statistical behaviors depending on the particularly layout style. It has been found that the particular layout chosen and the organization of unit capacitors 201 into array capacitors 101a–101e clearly affects linearity of ADC 100. Proper grouping of capacitors into array capacitors 101a–101e can minimize or eliminate spatially dependent contributions to variations of the ADC INL.

One layout strategy in accordance with the present invention groups unit capacitors 201 into array capacitors 101a–101e such that the spatial variations of each of the unit capacitors 201 in each array capacitor 101a–101e add together such that the ratio of the summed variations follows the desired ratio for the array capacitors 101a–101e. In this manner, the effect of the spatial variations is "canceled out" and will not affect linearity of the ADC. It should be understood that the variations are not literally canceled out as they can be and likely will be non-zero in each of the array capacitors. The term "canceled out" is used herein to mean that the spatial variations will not affect linearity.

This preferred layout strategy can be alternatively expressed as method for arranging a number (N) if devices D on a circuit chip. The desired ratio between array capacitors 101a–101e is expressed as a function relating a device parameter $P_j$ for each device $D_j$ to a device parameter $P_{j-1}$ for a device $D_{j-1}$ (i.e., $P_{j,(j>1)} \cong f(P_{j-1})$). For example the function $P_{j,(j>1)} = f(P_{j-1})$ is $P_{j,(j>1)} = 2*(P_{j-1})$ for a binary array used in a linear ADC (i.e., each capacitor is twice the size of another capacitor in the array).

Each chip includes a plurality of unit devices $D_u$ and each unit device $D_u$ has a parametric value of $P_u$. A linear component of spatial variation and a nonlinear component of spatial variation are determined for each of the unit devices $D_u$.

In the preferred layout strategy, the plurality of unit capacitors 201 are grouped into N sets such that each set j (where j is an integer from one to N) forms one of the number of devices $D_j$. In accordance with the preferred embodiment, each set j is chosen to have a parametric value $P_j$ satisfying the equation $P_{j,(1<j\leq N)} \cong f(P_{j-1})$, and at least one set comprises unit devices chosen such that $\Sigma V2_j \cong f(\Sigma V2_{j-1})$ where V2 is a nonlinear function describing a relationship between variance of $P_j$ and spatial location on the ADC chip.

One procedure for performing this selection is by first selecting the location of the smallest value array capacitor 101a such that the unit capacitor 201 (or capacitors 201) that are in array capacitor 101a exhibit the average linear and nonlinear variance from the mean capacitance. Hence, the unit capacitor 201 making up array capacitor 101a is by definition not an "ideal" capacitor as that term has been earlier defined. Once the LSB array capacitor 101a is selected, array capacitor 101b is selected to contain unit capacitors 201 that when summed together have twice the average capacitance and twice the variance capacitance (both linear and nonlinear variance) of LSB array capacitor 101a. Each array capacitor 101b–101e is selected in turn in this manner.

An important feature in accordance with the present invention is that this grouping of capacitors is based not only on linear errors but also on the nonlinear variations. Hence, while the grouping of unit capacitors 201 into array capacitors 101a–101e may be symmetric (and probably will be symmetric to account for linear variations) the symmetry may be more complex than found in prior array capacitors to account for the nonlinear errors.

In order to implement the complex symmetry arrangement generated by the layout method in accordance with the present invention, it is necessary that unit capacitors 201 for each array capacitor 101a–101e be able to be distributed across the surface of an integrated circuit. As will be seen, any array capacitor 101a–101e may comprise a plurality of unit capacitors 201 that are non-adjacent or are comprised of several non-adjacent subgroups of unit capacitors 201. Another feature of the present invention is a switching network that enables flexible grouping of unit capacitors.

Hence, the present invention involves not only a specific array for analog to digital conversion, but also a method for laying out matched capacitors, and more generally matched devices, on an integrated circuit to compensate for nonlinear spatial variations on an integrated circuit.

FIG. 1 illustrates in schematic form charge redistribution ADC 100 in accordance with the present invention. Charge redistribution ADC 100 is a 5-bit ADC, although it should be understood that the present invention is not limited to a 5-bit ADC design. ADC 100 comprises a plurality of array capacitors 101a, 101b, 101c, 101d, and 101e. Array capacitor 101a is a least significant bit (LSB) capacitor and comprises a single unit capacitor in a preferred embodiment. Array capacitor 101b comprises two unit capacitors; 101c four unit capacitors; 101d eight unit capacitors; and 101e sixteen unit capacitors to implement a binary linear ADC.

Other ratios can be used to provide other functionality such as a logarithmic analog-to-digital conversion, although a binary linear ADC is the most common. The top plates of array capacitors 101a–101e are coupled to differential threshold detector 102 which measures charge on the top plate of each of the array capacitors 101a–101e during the successive approximation process. The output of differential threshold detector 102 is coupled to a register 103 that stores the digital output. Register 103 in the preferred embodiment is a shift register having five digital outputs labeled $D_0$–$D_4$.

Switch 104 may be used to prevent differential threshold detector 102 from oscillating when it is reset. Switch 104 is closed during sampling and open during the hold and successive approximation phases of the conversion process. Switch 104 is controlled by the switch control output of successive approximation control 109. Use of switch 104 usually sacrifices speed. Alternatively, reset is accomplished by connecting inputs to differential threshold detector 102 to some bias voltage source (not shown), usually at half the supply voltage.

The input voltage $V_{in}$ is coupled to the bottom plate of array capacitors 101a–101e through the sample switches 107. Sample switches 107 are controlled by the SAMPLE control line generated by successive approximation control 109. During the sample phase, described hereinbefore, switches 107 are closed coupling $V_{in}$ to switch networks 108a–108e. During the sample phase, switches 106 are held open by the $\overline{\text{SAMPLE}}$ signal. Switches 106 and 107 are controlled by control signals from switch control output of successive approximation control 109 and operate in a substantially conventional manner akin to operation of a prior successive approximation charge redistribution ADC's.

In conventional ADCs the $V_{REF+}$, $V_{REF-}$, and $V_{in}$ if lines are coupled directly to the bottom plate of array capacitors 101a–101e. This is satisfactory because array capacitors 101a–101e usually have bottom plates that are accessible from the edge of the capacitor array in prior designs. However, the present invention relies on a greater flexibility in the placement of the unit capacitors 101a–101e within the array of unit capacitors 201 and so employs switch networks 108a–108e that are placed within the array 200 (shown in FIG. 2) rather than being lumped outside of array 200 as done in previous ADC circuits.

Switch networks 108a–108e receive the switched $V_{in}/V_{REF-}$ signal as determined by successive approximation control 109. During the sample phase, all of switches 108a–108e will receive the $V_{in}$ signal. During the redistribution or successive approximation phase all of switches networks 108a–108e will receive the $V_{REF+}$ and the $V_{REF-}$ signals. Each of switches networks 108a–108e is coupled to an inverted SAMPLE signal ($\overline{SAMPLE}$) and an inverted successive approximation signal ($\overline{SAR\_N}$) generated by successive approximation control 109. The $\overline{SAR\_N}$ control signal comprises five signals in the particular example of FIG. 1 labled $\overline{SAR\_1}$–$\overline{SAR\_{13}5}$.

FIG. 2 shows a plan view of an array of unit capacitors making up a portion of successive approximation ADC 100 shown in FIG. 1. Although the array of capacitors 200 is shown as a regular rectangular array, it is not necessary that such a geometry be used. One of the advantages of the present invention is that it enables a prediction of what specific geometry would best match array capacitors 101a–101e for a particular fabrication process and ADC design.

In FIG. 2, unit capacitors 201 that make up each of array capacitors 101a–101e are labeled with 1–5 respectively in FIG. 2. For example, the single unit capacitor 201 that makes up array capacitor 101a is labeled with an 1 in FIG. 2. Likewise, the two capacitors that make up array capacitor 101b are labeled with a 2, 101c labeled with a 3, 101d labeled with a 4, and 101e labeled with an 5. Array 200 also includes a coupling capacitor labeled C for coupling two 5-bit arrays to form a 10-bit analog-to-digital converter.

Each unit capacitor 201 is associated with a switch matrix component 202. Switch matrix components 202 combine to form switches 108a–108e shown in FIG. 1. Although switch matrix components 202 are shown alongside each unit capacitor 201, any arrangement that closely associates a unit capacitor with 201 with a switch matrix component 202 is acceptable. Wiring channels 203 are placed between columns of unit capacitors 201. Wiring channels 203 carry control and reference voltage signals to each of the individual switch matrix components 202. In contrast, prior unit capacitor arrays did not include any wiring channels or switch matrix components 202 between the unit capacitors. Until now, it was widely accepted that inclusion of circuitry and wiring channels 203 would detrimentally affect the matching ability of the array by spreading it out over a larger area. However, because of the present invention allows improved compensation for spatial variations, a larger area can be used while offering improved performance.

Wiring channels 203 include a plurality of wires extending down the length of columns of unit capacitors 201 to a common signal and voltage reference bus 204. It should be understood that wiring channels 203 could be placed in columns or between columns or between rows of unit capacitors 201 (or, both). The selection of which option to use is a matter of design choice.

Figure 3:
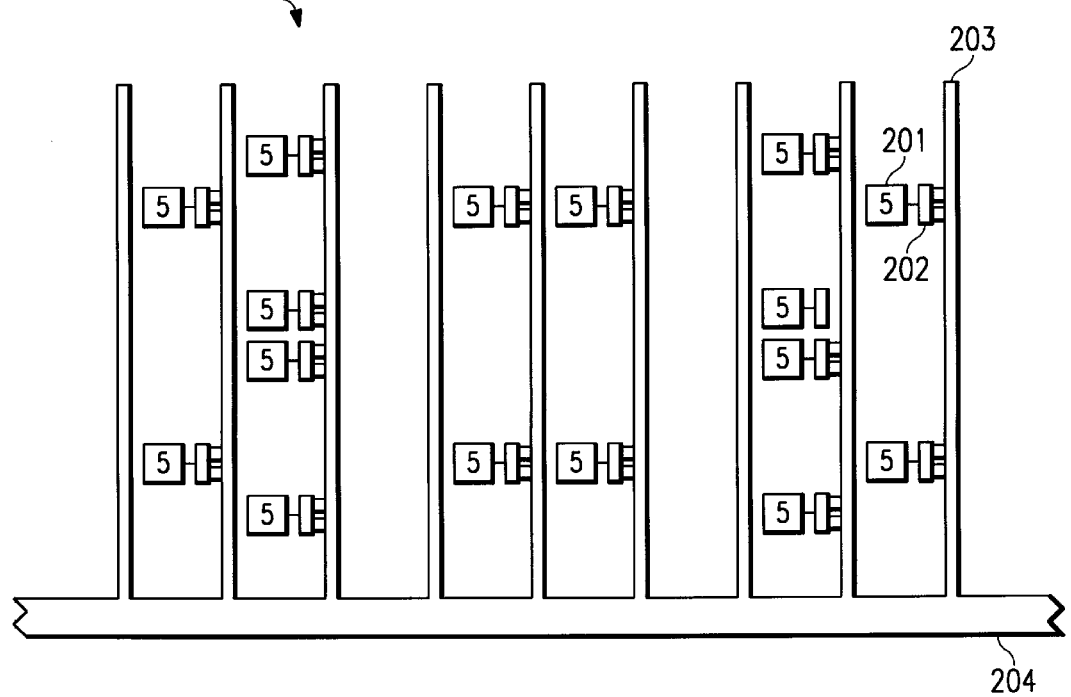
FIG. 3 illustrates a singular ray capacitor from the plan view of FIG. 2.

FIG. 3 illustrates a simplified view of array 200 shown in FIG. 2 to highlight the distributed nature of the array capacitors. To ease understanding, FIG. 3 illustrates only the connections that would make up array capacitor 100e shown in FIG. 1. It can be seen that many of the unit capacitors 201 chosen to make array capacitor 100e are not adjacent to any other unit capacitors 201 in array capacitor 100e and, significantly, are not adjacent to an edge of the array of unit capacitors 200. Wiring channels 203 are required to allow this flexibility in grouping of capacitors so that unit capacitors 201 can be distributed throughout the array of capacitors 200 while at the same time properly coupling the bottom plates of each of unit capacitors 201 to form array capacitors 101a–101e.

Referring to FIG. 2 and FIG. 3, it should be noted that several rows or columns of unit capacitors 201 may be unused in the layout method in accordance with the present invention. While at first this appears to be an inefficient use of space, the precision matching afforded by the present invention justifies the loss in space efficiency in many applications. Moreover, the unused capacitors or "dummy" units can be used alone and in combination to form a dummy array used to balance the input node impedances of differential threshold detector 102. For the dummy array, precision matching is not necessary and so any of the unused unit capacitors 201 may be connected in any convenient manner to form the dummy array.

Figure 4:
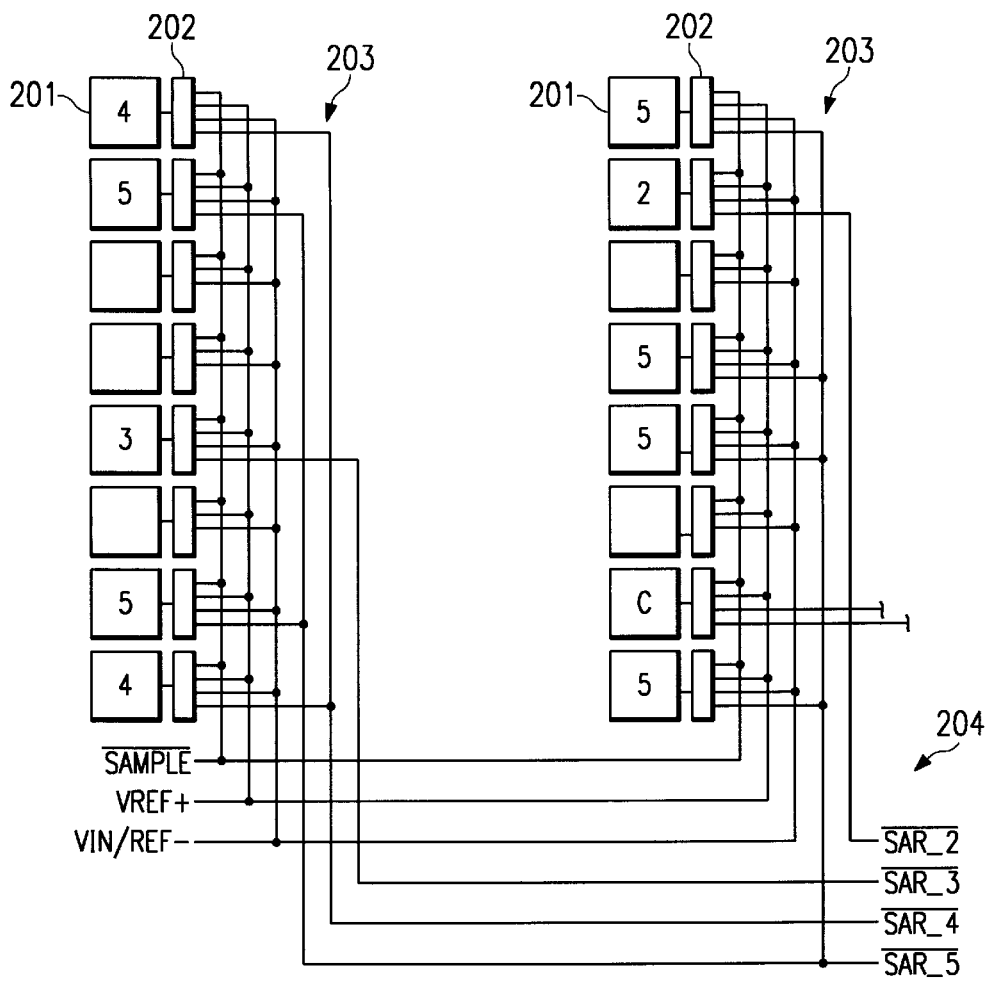
FIG. 4 shows a detailed plan view of the unit capacitor layout shown in FIG. 2.

FIG. 4 shows an enlarged plan view of capacitor array 200 highlighting the left-most two columns in capacitor array 200 shown in FIG. 2. Each switch matrix component 202 receives four input signals: $V_{in}/V_{REF-}$, $V_{REF+}$, the $\overline{SAMPLE}$ control signal, and the appropriate $\overline{SAR\_N}$ signal. The $\overline{SAMPLE}$ signal is common to each of the unit capacitors and requires only one wire in each wiring channel 203. The remaining $\overline{SAR\_N}$ signal ported to each switch matrix component 202 requires one wire for each unique array capacitor 201 represented in any column. In the array 200 shown in FIG. 2, no column includes portions of more than three array capacitors 101a–101e. Hence, all of the interconnections for the array capacitors 101a–101e can be made with no more than six wires in each wiring channel 203. Additional wires would be required to couple the dummy capacitors as desired.

It can be seen from FIG. 4 that all unit capacitors are coupled through wires in wiring channel 203 to the $V_{in}/V_{REF-}$, $V_{REF+}$ and $\overline{SAMPLE}$ portions of wiring bus 204. All of the unit capacitors labeled 5 are coupled to the $\overline{SAR\_5}$ line in wiring bus 204. Similarly, all of the unit capacitors labeled 4 are coupled to common $\overline{SAR\_4}$. Unit capacitors 201 labeled 3 and 2 and 1 in FIG. 2 are similarly coupled to $\overline{SAR\_3}$, $\overline{SAR\_2}$ and $\overline{SAR\_1}$ lines respectively. In this manner, unit capacitors 201 that are distributed throughout array 200 are coupled together to form array capacitors 101a–101e.

Figure 5:
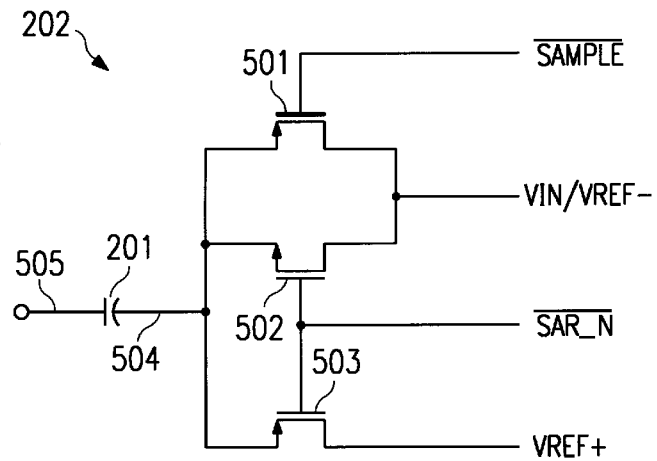
FIG. 5 illustrates in schematic form a switch matrix component in accordance with the present invention.

FIG. 5 shows a preferred circuit for implementing switch matrix components 202. Each switch matrix component includes a P-channel field effect transistor (FET) 501 having a gate coupled to the $\overline{SAMPLE}$ control signal. The source of FET 501 is coupled to the bottom plate node 504 of unit capacitor 201 while the drain of FET 501 is coupled to the $V_{in}/V_{REF-}$ signal line. N-channel FET 502 has its source coupled to node 504 and drain coupled to receive the $V_{in}/V_{REF-}$ signal line. P-channel FET 503 has its source coupled to node 504 and drain coupled to receive the $V_{REF+}$ reference voltage.

During the sample phase, the $\overline{SAMPLE}$ signal is a logic low and the $\overline{SAR\_N}$ signals are logic high such that the $V_{in}/V_{REF-}$ signal line is coupled to node 504. During the sample phase, the $V_{in}/V_{REF-}$ signal line is coupled to $V_{in}$ by the switch control output of successive approximation control 109 shown in FIG. 1. Following the sample phase, the $\overline{SAMPLE}$ line goes to a logic HIGH turning off FET 501. During the successive approximation phase, logic levels are asserted by $\overline{SAR\_N}$ turning on either transistors 502 or 503.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. An integrated circuit for analog to digital conversion comprising:
   a plurality of unit capacitors, wherein the value of each unit capacitor has a nonlinear spatial component determined by the location of the unit capacitor on the integrated circuit;
   a plurality of array capacitors, each array capacitor comprising a selected group of unit capacitors, wherein the unit capacitors that make up each array capacitor are selected based upon the nonlinear spatial component in the unit capacitance value.

2. The integrated circuit of claim 1 wherein each unit capacitor comprises a top metal capacitor plate, a bottom metal capacitor plate, and a capacitor dielectric separating the top and bottom metal capacitor plates.

3. The integrated circuit of claim 1 wherein the value of each unit capacitor also has a linear spatial component and the unit capacitors that make up each array capacitor are selected also based upon the linear spatial component.

4. The integrated circuit of claim 1 wherein the values of the array capacitors are related to each other such capacitance $C_j$ for each array capacitor is a preselected function $C_{j,j>1} \cong f(C_{j-1})$ for another device and the unit capacitors that make up each array capacitor are selected so that a ratio nonlinear spatial component of array capacitor $C_j$ to the nonlinear spatial component of array capacitor $C_{j-1}$ is substantially equal to the ratio $C_j:C_1$.

5. A method for arranging a number (N) of devices D on a circuit chip, wherein the devices are related to each other such that a device parameter $P_j$ for each device $D_j$ is a preselected function $P_{j,j>1} \cong f(P_{j-1})$ of the device parameter $P_{j-1}$ for another device $D_{j-1}$, the method for arranging comprising the steps of:
   providing a plurality of unit devices $D_u$ on the chip wherein each unit device $D_u$ has a parametric value of $P_u$;
   determining a linear component of variation V1 for each unit device $D_u$ wherein the V1 is function of spatial location of $D_u$ on the chip;
   determining a nonlinear component of variation V2 for each of unit devices $D_u$ wherein the V2 is function of spatial location of $D_u$ on the chip; and
   grouping the plurality of unit devices into N sets such that each set forms one of the number of devices $D_j$, each set j is chosen to have a parametric value $P_j$ satisfying the equation $P_{j,(1<j \leq N)} \cong f(P_{j-1})$, and at least one set comprises unit devices chosen such that $\Sigma V2_j \cong f(\Sigma V2_{j-1})$.

6. The method of claim 5 wherein the function $P_{j,j>1}=f(P_{j-1})$ is $P_{j,j>1}=2*(P_{j-1})$ and the members of the at least one set are chosen such that $\Sigma V2_j \cong 2*(\Sigma V2_{j-1})$.

7. The method of claim 5 wherein the function $P_{j,j>1}=f(P_{j-1})$ is $P_{j,j>1}=x^{(P_{j-1})}$ and the members of the at least one set are chosen such that $\Sigma V2_j \cong x^{(\Sigma V2_{j-1})}$.

8. The method of claim 5 wherein the devices are capacitors and the device parameter is capacitance.

9. The method of claim 5 wherein the step of determining a performance variation further comprises:
   measuring $P_u$ of each $D_u$ for a plurality of chips;
   calculating the covariance of $P_u$ with spatial location; and
   identifying the variance function V2 that describes a relationship between the measured $P_u$ and the spatial location of each unit device on the chip for each of the plurality of chips to a preselected degree of accuracy.

10. The method of claim 9 wherein the step of grouping comprises:
    calculating a mean value of V2, (V2), for all of the measured unit devices $D_u$;
    selecting a first set of unit devices such that the first set forms the device $D_1$ having $P_1 \cong P_u$ and $V2_1 \cong (V2)$;
    selecting a second set of unit devices such that the second set forms the device $D_2$ having $P_2 \cong f(P_1)$, and $\Sigma V2_2 \cong f(\Sigma V2_1)$; and
    sequentially selecting each larger set of unit devices to form devices $D_3$ through $D_N$ such that $P_j \cong f(P_{j-1})$, and $\Sigma V2_j \cong f(\Sigma V2_{j-1})$, where j is an integer from 3 to N.

11. The method of claim 5 wherein the second component of variation includes linear terms and quadratic terms.

12. A binary weighted array of capacitors comprising:
    a first set of unit capacitors having a capacitance of $C_u$ wherein $C_u$ comprises a linear spatial component and a nonlinear spatial component;
    a second set of unit capacitors having a capacitance of $C_2=2(C_1)$;
    a third set of unit capacitors having a capacitance of $C_3=2(C_2)$;
    a fourth set of unit capacitors having a capacitance of $C_4=2(C_3)$; and
    a fifth set of unit capacitors having a capacitance of $C_5=2(C_4)$.

13. The array of capacitors of claim 12 wherein at least one of the sets of unit capacitors comprise non-adjacent subgroups of unit capacitors that are distributed throughout the array of capacitors.

14. The array of capacitors of claim 12 wherein at least one of the sets of unit capacitors is not adjacent to an edge of the array.

* * * * *